United States Patent [19]
Varshney et al.

[11] Patent Number: 5,626,670
[45] Date of Patent: May 6, 1997

[54] METHOD FOR PRODUCING LOW THERMAL BUDGET FERROELECTRIC THIN FILMS FOR INTEGRATED DEVICE STRUCTURES USING LASER-CRYSTALLIZATION OF SPIN-ON SOL-GEL FILMS

[75] Inventors: Usha Varshney, Radford, Va.; Angus I. Kingon, Cary, N.C.

[73] Assignee: American Research Corporation of Virginia, Radford, Va.

[21] Appl. No.: 316,358

[22] Filed: Oct. 3, 1994

[51] Int. Cl.⁶ ............................ C30B 25/06
[52] U.S. Cl. ............... 117/7; 117/89; 427/126.3
[58] Field of Search .................. 117/7, 89, 92; 264/345; 427/126.3

[56] References Cited

U.S. PATENT DOCUMENTS

| | | | |
|---|---|---|---|
| 4,331,485 | 5/1982 | Gat | 437/1.6 |
| 4,375,993 | 3/1983 | Mori et al. | 437/1.9 |
| 4,523,962 | 6/1985 | Nishimura | 437/174 |
| 4,900,581 | 2/1990 | Stuke et al. | 427/555 |
| 4,946,710 | 8/1990 | Miller et al. | 427/126.3 |
| 5,028,455 | 7/1991 | Miller et al. | 427/126.3 |
| 5,116,643 | 5/1992 | Miller et al. | 427/126.3 |
| 5,146,299 | 9/1992 | Lampe et al. | 257/295 |
| 5,188,902 | 2/1993 | Lin | 428/426 |
| 5,198,269 | 3/1993 | Swartz et al. | 427/226 |
| 5,299,309 | 3/1994 | Kato | 395/162 |
| 5,348,775 | 9/1994 | Lin | 427/555 |

OTHER PUBLICATIONS

Arlt et al. (1988), "Internal Bias in Ferroelectric Ceramics . . . ", Ferroelectrics vol. 87, 1988, pp.109–120.
Banas et al. (1982), "Macro–Materials Processing", Proceedings of the IEEE, vol. 70, No. 6, pp. 556–565.
Bondurant, "Ferroelectric RAM Memory Family . . . ", Proceedings of the First Symposium . . . , Mar. 989, Colorado Springs, pp. 212–215.
Bullington et al., "RT–66A Standardized Ferroelectric Tester Operating Manual", Version 2.1, pp. 7–1 to 8–7.
Gifford et al. (1993), "Microstructure and Electrical Properties . . .", Mat. Res. Soc. Symp. Proc., vol. 243, pp. 191–196.
Okada et al., "Preparation of c–Axis–Oriented $PbTiO_3$ . . .", Jap. J. Appl. Phys., 1989, vol. 28, p. 1030.
Sankur et al. (1985), "Thin Film Deposition by Laser Assisted Evaporation", Appl. Optics, vol. 24, No. 20, pp. 3343–3347.
Schwartz et al. (1992), "Spectroscopic and Microstructural Characterization of Solution . . .", Mat. Res. Soc. Proc., vol. 243, pp. 245–261.
Scott et al. (1991), "Quantitative Measurement of Space–Charge Effects . . .", Journal of Applied Physics, vol. 70, pp. 382–388.

(List continued on next page.)

*Primary Examiner*—Felisa C. Garrett
*Attorney, Agent, or Firm*—James Creighton Wray

[57] ABSTRACT

A method for developing large area highly oriented polycrystalline ferroelectric thin films using spin-on sol-gel deposition and laser crystallization techniques that allow for precise control of temperature distribution. The present invention improves quality, reliability, performance and cost effective production of ferroelectric non-volatile random access memory (FNVRAM) on thermally sensitive silicon and gallium arsenide semiconductor substrates compatible with very large scale integrated circuit technologies. The method is time effective, as crystallization is performed in three seconds as compared to thirteen hours in a conventional furnace for 1 cm×1 cm wafer. In addition, crystallization of the film is further achieved without exposing the underneath device structure to detrimental high temperature annealing conditions. The present invention results in minimization of thermal budget, interdiffusion of substrates/electrodes/films and phase segregation, and increased compatibility of PZT ferroelectric thin films with thermally sensitive semiconductor substrates.

20 Claims, 1 Drawing Sheet

OTHER PUBLICATIONS

Swartz (1990), "Topics in Electronic Ceramics", IEEE Transactions in Electrical Insulation, vol. 25, No. 5, pp. 935–987.

Tuttle et al., "Characterization of Chemically Prepared PZT Thin Fibers", Mat. Res. Soc. Symp. Proc., 1990, vol. 200, pp. 159–165.

Varshney, "Laser Crystallization of Spin–On Ferroelectric Thin Films . . .", Proceedings of 1994 NSF Design . . . , at 655.

METHOD FOR PRODUCING LOW THERMAL BUDGET FERROELECTRIC THIN FILMS FOR INTEGRATED DEVICE STRUCTURES USING LASER-CRYSTALLIZATION OF SPIN-ON SOL-GEL FILMS

BACKGROUND OF THE INVENTION

The successful demonstration of a ferroelectric nonvolatile random access memory (FNVRAM) has led to considerable interest in improved fabrication methods for large area ferroelectric thin film structures. The basis of the FNVRAM is the thin film ferroelectric capacitor produced by two configurations: 1) by replacing the gate insulator with a thin film of ferroelectric oxide of a ferroelectric metal oxide field effect transistor (FEMFET), and 2) by using a ferroelectric capacitor where the charging current is measured in a complementary metal oxide semiconductor (CMOS). The ferroelectric oxides are inherently radiation-hard and the ferroelectric capacitor is unaffected by total dose, transient event or single event effects of electromagnetic pulses.

Existing manufacturing technologies for the development of ferroelectric digital memories have proven inadequate. Difficulties arise in ensuring reproducible deposition of large area, epitaxial or highly oriented polycrystalline thin films on semiconductor substrates which are compatible with very large scale integrated circuit (VLSIC) technology. Existing methods for depositing ferroelectric thin films include pulsed laser ablation deposition (PLAD), electron beam evaporation (EBE), ion beam deposition (IBD), molecular beam epitaxy (MBE), radio frequency (RF) and DC magnetron sputtering, sol-gel or metal organic decomposition (MOD) and metal organic chemical vapor deposition (MCOVD). None of these technologies are sufficient for the high volume manufacturing at low annealing temperatures (<500 degrees Celsius) needed for aluminum metallization in VLSIC. MBE is capable of providing thin films with uniform crystal structure, but is not cost-effective. PLAD techniques have proven limited in large area depositions. IBD and EBE are unacceptable for large area deposition because of their low deposition rate. MOD, sol-gel and MCOVD methods are appropriate for high volume manufacturing but require annealing temperatures of greater than 650 degrees Celsius. Annealing temperatures of this magnitude are not feasible when thermally sensitive semiconductor substrates, such as silicon or gallium arsenide, are used. The high temperatures induce high reactivity and instability of those substrates and result in deleterious effects in the underlying active device structures.

Interdiffusion between substrate, electrodes and ferroelectric films further exacerbates the problem and limits the use of standard aluminum metallization in CMOS applications for VLSIC manufacturing.

No existing technology provides for a film deposition process that can manufacture thin ferroelectric films with high-quality characteristics. Optimization of thin film properties is important, especially for electronic and electro-optic applications, since optical (transmittance, index of refraction, etc.), dielectric, piezoelectric, pyroelectric and electro-optic properties are sensitive to composition, crystal structure, stochiometry, crystallinity, density, microstructure and crystallographic orientation.

Needs have long existed for methods of depositing thin ferroelectric films on semiconductor substrates that are quick, inexpensive, can be done at low temperatures, and ensure uniform crystallization.

SUMMARY OF THE INVENTION

The present invention relates to a method for rapid laser crystallization of ferroelectric thin films deposited on thermally sensitive semiconductor substrates by a spin-on technique. The invention involves dispensing a precursor solution onto a substrate, rotating the substrate at a high velocity to produce a planar film, and annealing and crystallizing the film to produce an oxide. Crystallization is performed by a laser, based on the principle that photon energy is absorbed by the material under fabrication, thereby resulting in heating through a photon-phonon conversion process. The present invention has the significant advantage of rapidly depositing high device quality, large area ferroelectric thin films and minimizing overall thermal budget, substrate/electrode/film interdiffusion and phase segregation, and increased compatibility with semiconductor substrates.

This deposition and laser crystallization process is successful in depositing large area, highly oriented polycrystalline ferroelectric thin films. The invention, in comparison with existing technologies, improves the quality, reliability, performance and cost effective production of FNVRAM on thermally sensitive silicon and gallium arsenide semiconductor substrates compatible with VLSIC technologies.

Laser crystallization is a significant improvement over existing technologies because of its ability to integrate a crystallized ferroelectric thin film in a memory device structure without exposing the underneath active device structures to conventional high temperature annealing procedures. Since during laser crystallization the rates of heating and cooling are high, the present invention eliminates phase separation problems associated with other wet processes and reduces film/substrate interdiffusion also inherent in other fabrication processes. The elimination of interdiffusion problems reduces aging and fatigue and improves the retention characteristics of non-volatile random access memories. These advantages make the invention highly compatible with the standard aluminum metallization technology being widely used in VLSIC manufacturing.

Overall, using a laser to crystallize a film is more time efficient than existing methods, as the crystallization is performed in three seconds as compared to thirteen hours in a conventional furnace for 1 cm×1 cm wafer.

The disclosed process can be implemented in a number of commercial markets, including markets for non-volatile memory devices, integrated optical components and circuits, surface acoustic wave filters, high speed packages, transducers, pyroelectric sensors, memory cells, actuators, electro-optic devices, pyrodetectors, infrared imagers, SAW and piezoelectric transducers. Potential applications further extend to photonic and opto-electronic devices such as beam steering and rapid beam deflectors, optical bistability, optical neurocomputers, non-linear optical signal processing, real time (dynamic) holography for reconfigurable interconnects and routing networks, image storage, phase conjugate interferometry, and two-wave and four-wave mixing. These and further and other objects and features of the invention are apparent in the disclosure, which includes the above and ongoing written specification, with the claims and the drawings.

DETAILED DESCRIPTION OF THE PREFERRED EMBODIMENTS

The present invention is a method for depositing and crystallizing ferroelectric thin films to produce integrated device structures for applications in non-volatile random access memories.

A precursor solution 25 of PZT sol-gel is produced that has the molecular makeup desired for the ferroelectric film. The film precursors may include metal alkoxides, alkoxy-alkoxides, and amino-substituted alkoxides. Sol-gel offers a number of advantages such as accurate compositional control which is important for multicomponent systems, ease of process integration with standard semiconductor manufacturing technology, electrical properties approaching those of bulk PZT ceramics, and comparatively low capital investment. For sol-gel process the product microstructure can be controlled by manipulating the molecular precursor structure through chemical reactions. A preferred embodiment of the present invention uses a PZT sol-gel solution with a zirconate/titanate ratio of 53/47 and 5 mole % excess lead. The sol-gel solution is prepared by using metallo-organic solutions of titanium isopropoxide, zirconium butoxide 80% in 1-butanol, lead IV acetate, acetic acid and methanol as per the following procedure. 4.6 ml of zirconium butoxide in 1-butanol is measured in a beaker and, while stirring, 2.8 ml of titanium isopropoxide is added. The mixed solution is allowed to stir for five minutes before adding 4.93 ml of acetic acid and later 10 ml of methanol. While stirring, 10.34 gm of lead IV acetate is added. The combined solution is heated to 85 degrees Celsius and stirred for 10 minutes until the lead IV acetate is completely dissolved. The solution is then cooled to 70 degrees Celsius, and 5 ml of acetic acid and 10 ml of methanol are added. The solution is further cooled to 60 degrees Celsius, and 5 ml of acetic acid is added. The whole solution is then diluted to 50 ml using deionized water.

Figure 2:
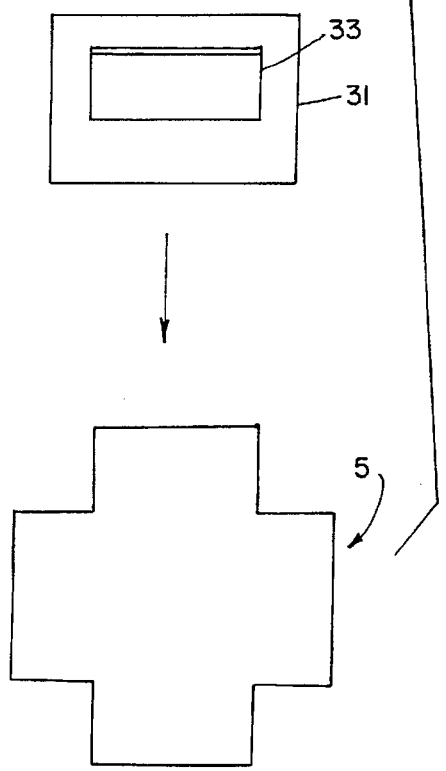
FIG. 2 shows the steps of the present invention for depositing and crystallizing a ferroelectric thin film on a substrate.

The precursor solution is applied to a semiconductor substrate 33. This application can be performed using a spin-on techniques as illustrated in FIG. 2. The present invention is effective even when thermally sensitive substrates 33, such as silicon and gallium arsenide, are used. The semiconductor substrate 33 is placed on a chuck 27 mounted on a spin caster 29. As the spin caster 29 is rotated, the precursor solution is evenly applied to the substrate 33. A spin caster 29 capable of spinning from 1,200 rpm to 12,000 rpm can be used. A preferred embodiment of the invention uses a spin caster 29 with a rotation speed of 3,500 rpm for 50 seconds in order to achieve a homogeneous deposition of the film with an average layer thickness of 1000 Å. The preferred embodiment of the present invention dries the spin-on film using an oven 31 at 350 degrees Celsius for 5 minutes to pyrolyze the residual organic species.

Figure 1:
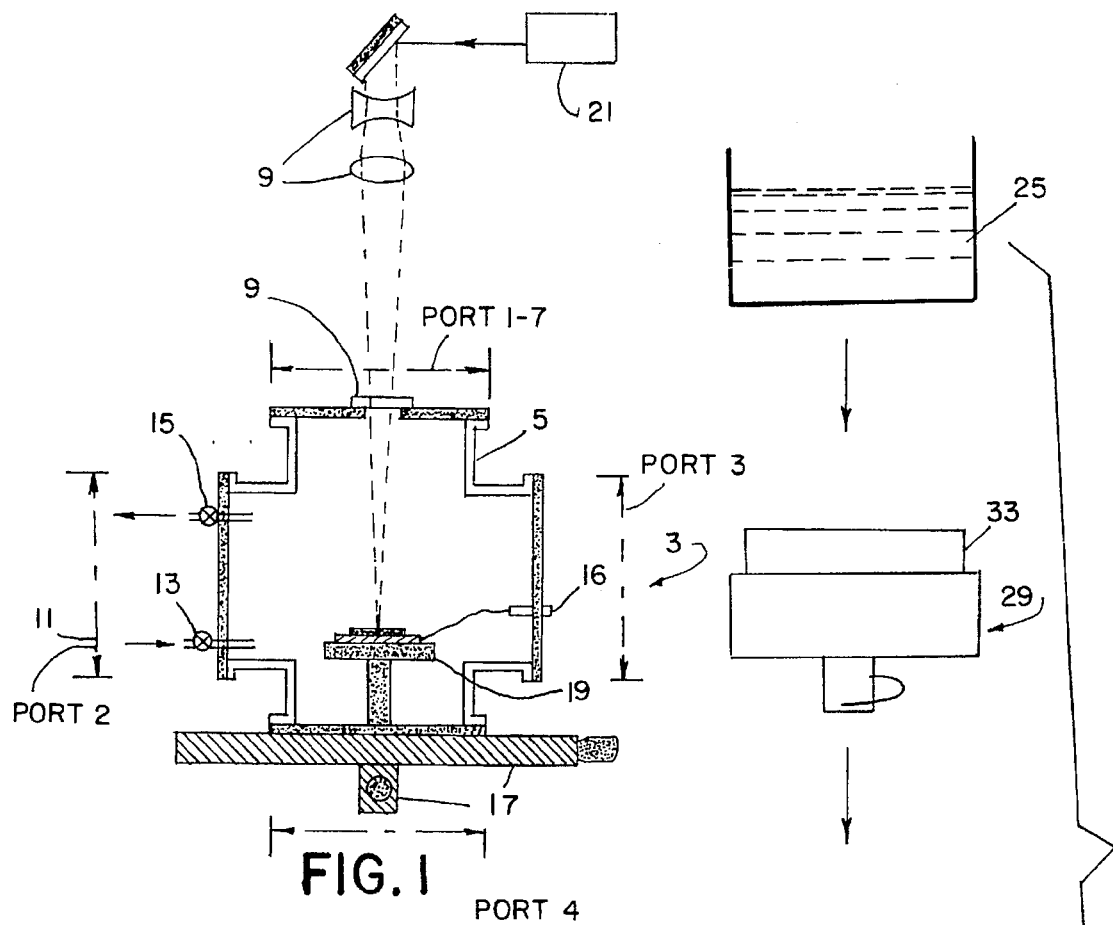
FIG. 1 is an illustration of the computer-controlled laser crystallization chamber.

FIG. 1 is an illustration of the computer-controlled laser crystallization chamber used in the present invention. Following deposition of the film onto the substrate 33, the substrate 33 is placed on a chuck 1 in a computer-controlled laser processing chamber 3. The chamber 3 is capable of being evacuated to provide for an inert environment in the chamber. The chuck 1 is made of aluminum and is capable of heating from room temperature to 500 degrees Celsius. The laser processing chamber 1 consists of a four-way quartz tube 5. A preferred embodiment of the present invention uses a chamber made of pyrex. Port one 7 is fitted with correction optics 9 for focusing the laser beam on the substrate 33, and port two 11 has a gas inlet 13 and outlet 15 to regulate the atmosphere during pre-anneal and crystallization processes. The temperature within the chamber is controlled by a chromel-alumel thermocouple 16 in conjunction with a microcomputer thermometer. The chamber is mounted on an X-Y motion control table 17 capable of translating 10 cm in the X and Y direction at a translating rate from 0.1 to 19.5 mm/s with a minimum distance of 10 μm between the scans. The substrate holder 19 which supports the substrate is capable of being heated to 500 degrees Celsius in an inert environment to avoid cracking and peeling of the film from the substrate due to thermal shock during laser processing. The cooling rate of the film/substrate 33 is controlled as the domain structure of the resulting film is directly related to the temperature history through the paraelectric to ferroelectric phase transition. The underlying nucleation and growth rates that occur during cooling are increasingly important, as the transport properties of these films are sensitive functions of their growth morphologies.

The substrate 33, once placed inside the chamber, is crystallized by a laser 21. The laser 21 can operate in either a continuous or a pulse mode. In one embodiment of the present invention, the laser crystallization is performed using a laser wavelength of 248 nm, an energy density of 25 mJ/cm$^2$, a pulse repetition rate of 5 pulses per second, a crystallizing time of five seconds, and a pulse duration of 10 ns. Using these parameters, the spin-on PZT thin film is crystallized to a single phase perovskite structure ferroelectric thin film on both platinized and aluminized oriented silicon wafers without film/electrode interdiffusion. Similar results are achieved using parameters that include 25 mJ/cm$^2$, a pulse repetition rate of 2 pulses per second, a crystallization time of 7.5 seconds, and a pulse duration of 8 ns.

While the invention has been described with reference to specific embodiments, modificatio ns and variations of the invention may be constructed without departing from the scope of the invention, which is defined in the following claims.

We claim:

1. A method for crystallizing a ferroelectric thin film on a substrate comprising the steps of creating a film precursor solution, depositing the film precursor solution as a thin film on the substrate, thus creating a thin film-coated substrate, heat treating the film and pyrolyzing residual organic species in the film, placing the film-coated substrate in a laser crystallization chamber, evacuating the chamber providing an inert environment in the chamber, providing a laser beam, directing the laser beam into the chamber, directing the laser beam onto the film on the substrate, relatively moving the laser beam and the film-coated substrate, and laser crystallizing the film on the substrate in a laser crystallization chamber.

2. The method of claim 1, further comprising mounting the laser crystallization chamber on a X-Y motion controlled table and wherein the moving comprises moving the table, chamber and film-coated substrate with respect to the laser beam.

3. The method of claim 2, wherein mounting the laser crystallization chamber on a X-Y motion controlled table comprises mounting the laser crystallization chamber on a motion controlled table capable of translating 10 cm in the X and Y direction.

4. The method of claim 2, wherein mounting the laser crystallization chamber on a X-Y motion controlled table comprises mounting the laser crystallization chamber on a motion controlled table that translates at a rate ranging between 0.1 and 19.5 mm/s with a minimum of 10 µm between scans.

5. The method of claim 1, wherein the placing step further comprises mounting the film-coated substrate on an aluminum chuck, positioning the chuck on a holder inside the laser crystallization chamber, focusing the laser beam on the film-coated substrate mounted on the chuck, and laser heating the film on the substrate.

6. The method of claim 5, wherein positioning the chuck on a holder further comprises positioning the chuck on a holder capable of being heated up to 500 degrees Celsius.

7. The method of claim 1, wherein the depositing step further comprises placing a substrate on a chuck mounted on a spin caster, rotating the spin caster, and depositing the film precursor solution as a thin film on the substrate as the spin caster rotates.

8. The method of claim 7, wherein the rotating comprises rotating the spin caster at a rate between 1,200 and 12,000 revolutions per minute.

9. The method of claim 1, wherein the step for providing a laser beam comprises providing the laser beam from a continuous laser source.

10. The method of claim 1, wherein the step for providing a laser beam comprises providing the laser beam from a pulse mode laser source.

11. The method of claim 1, wherein creating the film precursor solution comprises creating a precursor solution for a pyrolyzed lead zirconate titanate (PZT) sol-gel.

12. The method of claim 11, wherein creating the film precursor solution further comprises creating a sol-gel solution having a Zr/Ti ratio of 57/43 and 5% excess Pb.

13. The method of claim 1, wherein creating the film precursor solution comprises creating a precursor solution containing metal alkoxides.

14. The method of claim 1, wherein creating the film precursor solution comprises creating a precursor solution containing alkoxy-alkoxides.

15. The method of claim 1, wherein creating the film precursor solution comprises creating a precursor solution containing a mino-substituted alkoxides.

16. The method of claim 1, wherein providing a laser beam comprises providing a laser beam with para meters including a laser wavelength of 248 nm, an energy density of 25 mJ/cm$^2$, a pulse repetition rate of 5 pulses per second, a crystallization time of 5 seconds, and a pulse duration of 10 ns.

17. The method of claim 1, wherein providing a laser beam comprises providing a laser beam with para meters including a laser wavelength of 248 nm, an energy density of 25 mJ/cm$^2$, a pulse repetition rate of 2 pulses per second, a crystallization time of 7.5 seconds, and a pulse duration of 8 ns.

18. The method of claim 1, wherein laser crystallizing comprises laser crystallizing the film on the substrate in a laser crystallization chamber further comprising a four-way quartz tube having a first port fitted with correction optics, and a second port with a gas inlet and gas outlet, a thermocouple for regulating temperature within the chamber, and a microcomputer thermometer that works in conjunction with the thermocouple for regulating temperature.

19. The method of claim 18, wherein laser crystallizing comprises laser crystallizing the film on the substrate in a laser crystallization chamber using a chromel-alumel thermocouple to control the temperature within the chamber.

20. The method of claim 1, wherein laser crystallizing comprises laser crystallizing the film in a laser crystallization chamber made of pyrex.

* * * * *